US011320463B2

(12) United States Patent
Liu

(10) Patent No.: US 11,320,463 B2
(45) Date of Patent: May 3, 2022

(54) CURRENT DETECTION DEVICE

(71) Applicants:Kabushiki Kaisha Toshiba, Tokyo (JP); Toshiba Electronic Devices & Storage Corporation, Tokyo (JP)

(72) Inventor: Jia Liu, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/017,961

(22) Filed: Sep. 11, 2020

(65) Prior Publication Data

US 2021/0190832 A1  Jun. 24, 2021

(30) Foreign Application Priority Data

Dec. 19, 2019 (JP) .............................. JP2019-229597

(51) Int. Cl.
*G01R 15/20* (2006.01)
*G01R 19/00* (2006.01)

(52) U.S. Cl.
CPC ......... *G01R 15/202* (2013.01); *G01R 15/207* (2013.01); *G01R 19/0092* (2013.01)

(58) Field of Classification Search
CPC .......................... G01R 15/202; G01R 15/207; G01R 19/0092; G01R 15/148; G01R 15/188
USPC .............................................. 324/126, 207.2
See application file for complete search history.

(56) References Cited

U.S. PATENT DOCUMENTS

| 6,462,531 | B1 | 10/2002 | Ohtsuka | |
|---|---|---|---|---|
| 6,683,448 | B1 | 1/2004 | Ohtsuka | |
| 6,791,313 | B2 | 9/2004 | Ohtsuka | |
| 8,896,295 | B2* | 11/2014 | Friedrich | G01R 15/207 324/207.2 |
| 2016/0231364 | A1* | 8/2016 | Nejatali | H02J 50/12 |
| 2018/0340986 | A1* | 11/2018 | Latham | G01D 5/14 |
| 2020/0174043 | A1* | 6/2020 | Liu | G01R 15/148 |
| 2020/0174044 | A1* | 6/2020 | Liu | G01R 33/02 |
| 2020/0292585 | A1* | 9/2020 | Liu | H01F 5/02 |
| 2020/0292592 | A1* | 9/2020 | Liu | G01R 19/15 |

FOREIGN PATENT DOCUMENTS

| JP | 63-191069 | A | 8/1988 |
|---|---|---|---|
| JP | 2001-165963 | A | 6/2001 |
| JP | 2001-339109 | A | 12/2001 |
| JP | 4164615 | B2 | 10/2008 |
| JP | 5500956 | B2 | 5/2014 |

* cited by examiner

*Primary Examiner* — Tung X Nguyen
*Assistant Examiner* — Robert P Alejnikov, Jr.
(74) *Attorney, Agent, or Firm* — Allen & Overy LLP

(57) ABSTRACT

A current detection device includes a first coil, a magnetic field detection element, a shield layer, a second coil, and an operation circuit. The first coil has a planar shape. The magnetic field detection element is disposed in a spaced apart manner from the first coil in a direction orthogonal to a plane of the first coil, and is disposed so as to receive a magnetic field which the first coil generates. The shield layer is disposed between the first coil and the magnetic field detection element. The second coil is disposed in a spaced apart manner from the first coil with respect to an axis perpendicular to the shield layer. The operation circuit operates the second coil.

8 Claims, 6 Drawing Sheets

CURRENT DETECTION DEVICE

CROSS-REFERENCE TO RELATED APPLICATION

This application is based upon and claims the benefit of priority from Japanese Patent Application No. 2019-229597, filed on Dec. 19, 2019; the entire contents of which are incorporated herein by reference.

FIELD

An embodiment described herein relates generally to a current detection device.

BACKGROUND

In a current detection device, a current to be detected is supplied to a coil, and the current is detected by detecting a magnetic field generated from the coil. The generated magnetic field is detected by a Hall element, for example. To ensure high-performance and stable operation of the current detection device, in general, there has been known a structure where a shield layer (shield sheet) is disposed between the coil and the Hall element.

In a structure which includes the shield layer, when a current which flows through the coil is an AC current, particularly, a high frequency AC current, an eddy current is generated on the shield layer, so that a magnetic field is generted by the eddy current in a direction opposite to a direction of a magnetic field generated by the current flowing in the coil. Accordingly, since the magnetic field generated by the eddy current is in a direction opposite to the direction of the magnetic field generated by the coil, the magnetic field generated by the eddy current cancels the magnetic field generated by the coil. The magnetic field detected by the Hall element becomes insufficient and hence, an output voltage from a drive circuit of the Hall element is lowered. Accordingly, in the conventional current detection device, the detection of a current is performed by amplifying an output voltage from the drive circuit of the Hall element by an amplifying circuit.

DETAILED DESCRIPTION

A current detection device according to an embodiment includes a first coil, a magnetic field detection element, a shield layer, a second coil, and an operation circuit. The first coil has a planar shape. The magnetic field detection element is disposed in a spaced apart manner from the first coil in a direction orthogonal to a plane of the first coil, and is disposed so as to receive a magnetic field which the first coil generates. The shield layer is disposed between the first coil and the magnetic field detection element. The second coil is disposed in a spaced apart manner from the first coil with respect to an axis perpendicular to the shield layer. The operation circuit operates the second coil.

Hereinafter, the embodiment is described in detail with reference to drawings.

First, a configuration of the current detection device according to the embodiment is described with reference to FIG. 1 and FIG. 2.

Figure 1:
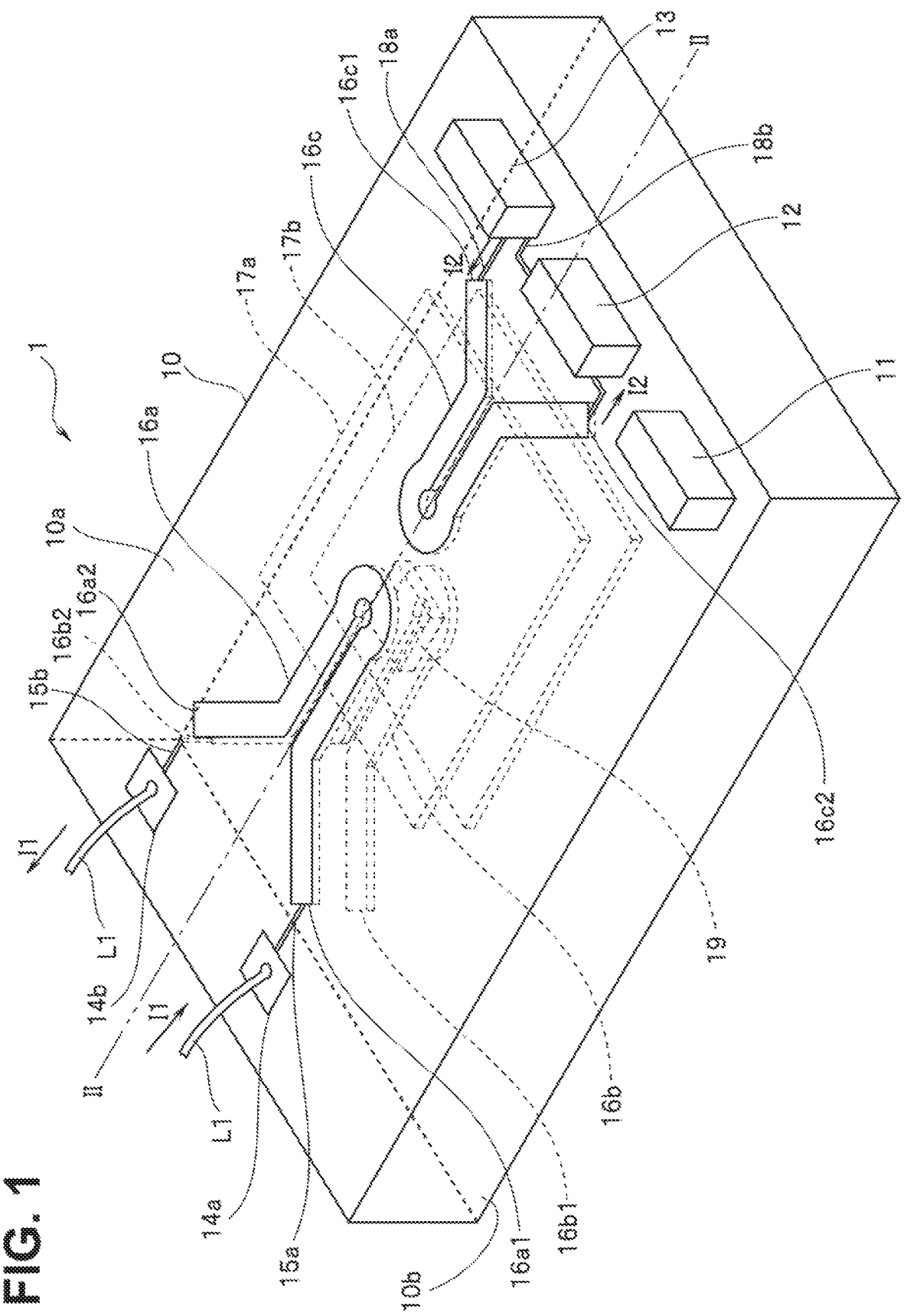
FIG. 1 is a view showing an entire configuration of a current detection device according to an embodiment.
Figure 2:
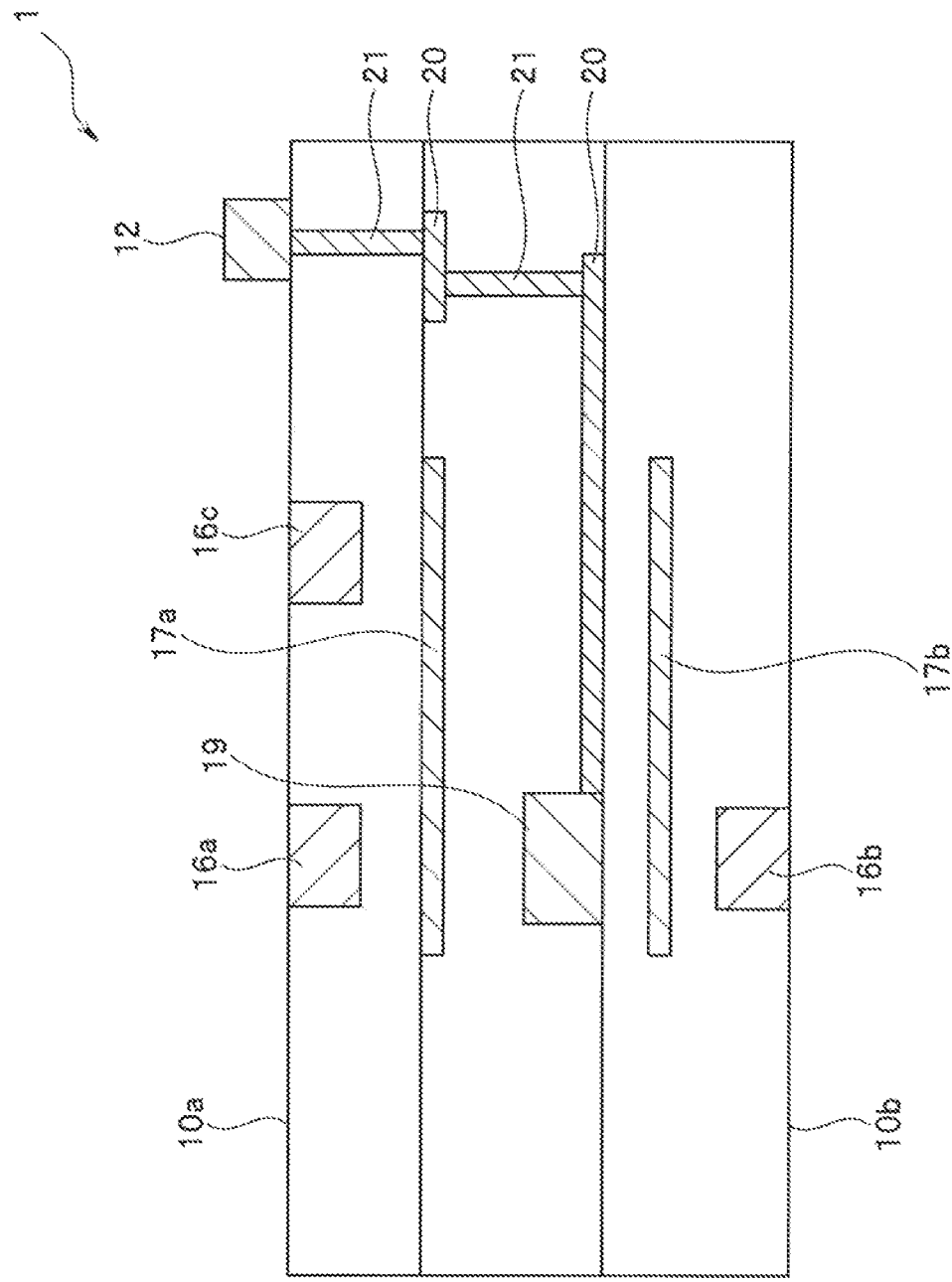
FIG. 2 is a cross-sectional view of the current detection device shown in FIG. 1 taken along a line II-II.

FIG. 1 is a view showing an entire configuration of the current detection device according to the embodiment. FIG. 2 is a cross-sectional view of the current detection device shown in FIG. 1 taken along a line II-II.

The current detection device 1 detects a current I1 which flows through wirings LI. A current to be detected is a DC current or an AC current. The current detection device 1 is configured of a sheet of substrate 10 having a stacked structure. The current detection device 1 according to the embodiment is used for an overcurrent protection or the like of a PFC (power factor correction) power source, a high-frequency switching power source, an AC/DC adaptor, a control device such as a general-purpose invertor or a motor variable speed device, and a power module.

In the embodiment, the current detection device 1 is formed of a sheet of substrate 10 having a stacked structure. However, for example, the current detection device 1 according to the embodiment may be formed by laminating two substrates or three or more substrates.

The substrate 10 is formed in a rectangular shape, and has a flat surface 10*a* on a front surface side and a flat surface 10*b* on a back surface side. Note that a shape of the substrate 10 is not limited to the rectangular shape, and may be other shapes such as a circular shape.

On the surface 10*a*, an amplifying circuit 11 which amplifies a voltage signal detected by a Hall element 19 described later, a drive circuit 12 which drives the Hall element 19, and an operation circuit 13 which operates a coil pattern 16*c* constituting the second coil described later are disposed.

On the surface 10*s*, pads 14*a* and 14*b* to which two wirings L are connected, wiring patterns 15*a* and 15*b* which extend from the pads 14*a* and 14*b*, and a coil pattern 16*a* which includes a planar coil having an arcuate shape and straight line portions extending from end portions of the planar coil and disposed parallel to each other are disposed are formed.

Although the coil pattern 16*a* includes the straight line portions disposed parallel to each other, the coil pattern 16*a* is not limited to such a configuration, and may not include the straight line portions disposed parallel to each other. The coil pattern 16*a* may be any coil which can generate a magnetic flux, and a shape of the coil pattern 16*a* is not limited to the shape shown in FIG. 1. The same goes for coil patterns 16*b* and 16*c* described later.

The coil pattern 16*a* constituting the first coil includes one end portion 16*a*1 and an other end portion 16*a*2, where the one end portion 16*a*1 is connected to the wiring pattern 15*a*. With such a configuration, a current I1 input to the wiring L1 flows from the one end portion 16*a*1 to the other end portion 16*a*2 of the coil pattern 16*a*.

On the surface 10*b*, the coil pattern 16*b* which includes a planar coil having an arcuate shape and straight line portions extending from end portions of the planar coil and disposed parallel to each other is formed. The coil pattern 16b constituting the third coil includes the one end portion 16b1 and the other end portion 16b2. The one end portion 16b1 of the coil pattern 16b is electrically connected to the other end portion 16a2 of the coil pattern 16a. The other end portion 16b2 of the coil pattern 16b is electrically connected to the wiring pattern 15b.

More specifically, the one end portion 16b1 of the coil pattern 16b is electrically connected to the other end portion 16a2 of the coil pattern 16a via a plurality of wiring patterns and a plurality of conductors disposed in a plurality of contact holes (that is, via holes). The other end portion 16b2 of the coil pattern 16b is electrically connected to the wiring pattern 15b via a plurality of wiring patterns and a plurality of conductors disposed in a plurality of contact holes. The drive circuit 12 is electrically connected to the Hall element 19 via a plurality of wiring patterns 20 and a plurality of conductors 21 disposed in a plurality of contact holes. An electrical connection is not limited to the contact holes, and connector parts such as clamping connectors may be used.

With such a configuration, a current I1 inputted from the other end portion 16a2 of the coil pattern 16a to the coil pattern 16b flows from the one end portion 16b1 to the other end portion 16b2 of the coil pattern 16b. As a result, a direction of the magnetic field generated by the coil pattern 16a and a direction of a magnetic field generated by the coil pattern 16b become equal. In the description made hereinafter, the direction of the magnetic fields generated by the coil patterns 16a and 16b is referred to as a first direction.

On the surface 10a, the coil pattern 16c which includes a planar coil having an arcuate shape and straight line portions extending from end portions of the planar coil and disposed parallel to each other is formed. The coil pattern 16c is disposed in a spaced apart manner from the coil pattern 16a with respect to an axis 33 (see FIG. 3) perpendicular to a shield layer 17a.

The coil pattern 16c constituting the second coil includes one end portion 16ci and the other end portion 16c2. The one end portion 16c1 is connected to a wiring pattern 18a, and the other end portion 16c2 is connected to a wiring pattern 18b. The wiring patterns 18a, 18b are connected to the operation circuit 13.

The operation circuit 13 is configured of an oscillation circuit or a high-frequency circuit, and supplies a current I2 to the coil pattern 16c from the one end portion 16c1 to the other end portion 16c2. The current I2 is supplied to the coil pattern 16c from the operation circuit 13 disposed on the surface 10a. However, the embodiment is not limited to such a configuration, and the current I2 may be supplied to the coil pattern 16c from the outside of the current detection device 1.

Between the coil pattern 16a and the Hall element 19, the shield layer 17a is disposed. The shield layer 17a is provided for shielding an electrostatic noise or an electromagnetic noise from entering the Hall element 19 or the amplifying circuit I1 which amplifies a voltage signal detected by the Hall element 19. In the same manner, between the coil pattern 16b and the Hall element 19, a shield layer 17b is disposed. The shield layer 17b is provided for shielding an electrostatic noise or an electromagnetic noise from entering the Hall element 19 or the amplifying circuit 11 which amplifies a voltage signal detected by the Hall element 19. The shield layers 17a and 17b are formed of a sheet member made of a conductive material such as copper or aluminum. The shield layers 17a and 17b are connected to a ground of a product (for example, the substrate 10 or a module) or a ground surface when necessary.

Eddy currents are generated in the shield layers 17a and 17b when magnetic fields in the first direction are generated by the coil patterns 16a and 16b. Due to such eddy currents generated in the shield layers 17a and 17b, magnetic fields in the second direction opposite to the magnetic fields in the first direction are generated.

In the embodiment, the current detection device 1 includes three coil patterns 16a. 16b, and 16c. However, the number of coil patterns is not limited to three, and 0.7, the current detection device 1 may include two coil patterns or four or more coil patterns. In the embodiment, the current detection device 1 includes two shield layers 17a and 17b. However, the number of shield layers is not limited to two, and the current detection device 1 may include one shield layer or three or more shield layers.

The magnetic fields in the first direction generated by the coil patterns 16a and 16b are cancelled by the magnetic fields generated by the eddy currents in the second direction which is a direction opposite to the first direction. In this manner, the magnetic fields in the first direction are cancelled by the magnetic fields in the second direction. As a result, a magnetic field detected by the Hall element 19 is lowered and hence, the current detection device 1 cannot accurately detect the current I1 which flows through the coil patterns 16a and 16b. In other words, performance of the current detection device 1 is lowered.

In the embodiment, as described later, by supplying the current I2 from the operation circuit 13 to the coil pattern 16c, an eddy current is generated in the shield layer 17a, and the eddy current which is generated by supplying the current I1 to the coil pattern 16a can be cancelled so that the magnetic field in the second direction can be reduced.

The Hall element 19 which is a magnetic sensor is disposed in the substrate 10. The Hall element 19 is disposed to be positioned between the two coil patterns 16a and 16b. More specifically, the Hall element 19 is disposed to be positioned between the shield layers 17a and 17b. The Hall element 19 which is the magnetic field detection element generates an electromotive force proportional to magnetic flux density, and outputs a voltage signal corresponding to the electromotive force.

In other words, the two respective coil patterns 16a and 16b each have the planar coil having an arcuate shape and the straight line portions extending from the end portions of the planar coil and disposed parallel to each other. The Hall element 19 is disposed in a spaced apart manner from the respective coil patterns 16a, 16b in the direction orthogonal to planes of the two coil patterns 16a and 16b, and are disposed so as to receive magnetic fields which the respective coil patterns 16a, 16b generate when a current is supplied to the two coil patterns 16a and 16b.

More specifically, a center axis of a magnetic flux which the coil pattern 16a generates and a center axis of a magnetic flux which the coil pattern 16b generates are positioned on a same axis, and the Hall element 19 is disposed between the coil patterns 16a, 16b, and also disposed on the same axis.

An output signal (voltage signal) of the Hall element 19 is inputted to the amplifying circuit 11 disposed on the substrate 10 via a plurality of wiring patterns and a plurality of conductors disposed in a plurality of contact holes formed in the substrate 10 and in the substrate 10, and the output signal (voltage signal) is amplified. The Hall element 19 outputs the voltage signal by detecting the magnetic fluxes generated by the current I1 inputted to the coil patterns 16a, 16b However, an amplitude of the voltage is small. Accordingly, the voltage is amplified by the amplifying circuit 11 so that the current I1 inputted to the coil patterns 16a, 16b can be observed.

In the embodiment, the two coil patterns 16a, 16b are disposed so as to sandwich the Hall element 19. However, the number of coil patterns may be one. Although the two shield layers 17a, 17b are disposed so as to sandwich the Hall element 19 in the embodiment, the number of shield layer may be one in this case. For example, when the current detection device 1 includes one coil pattern and one shield layer, the one shield layer may be disposed between the one coil pattern and the Hall element 19.

Figure 3:
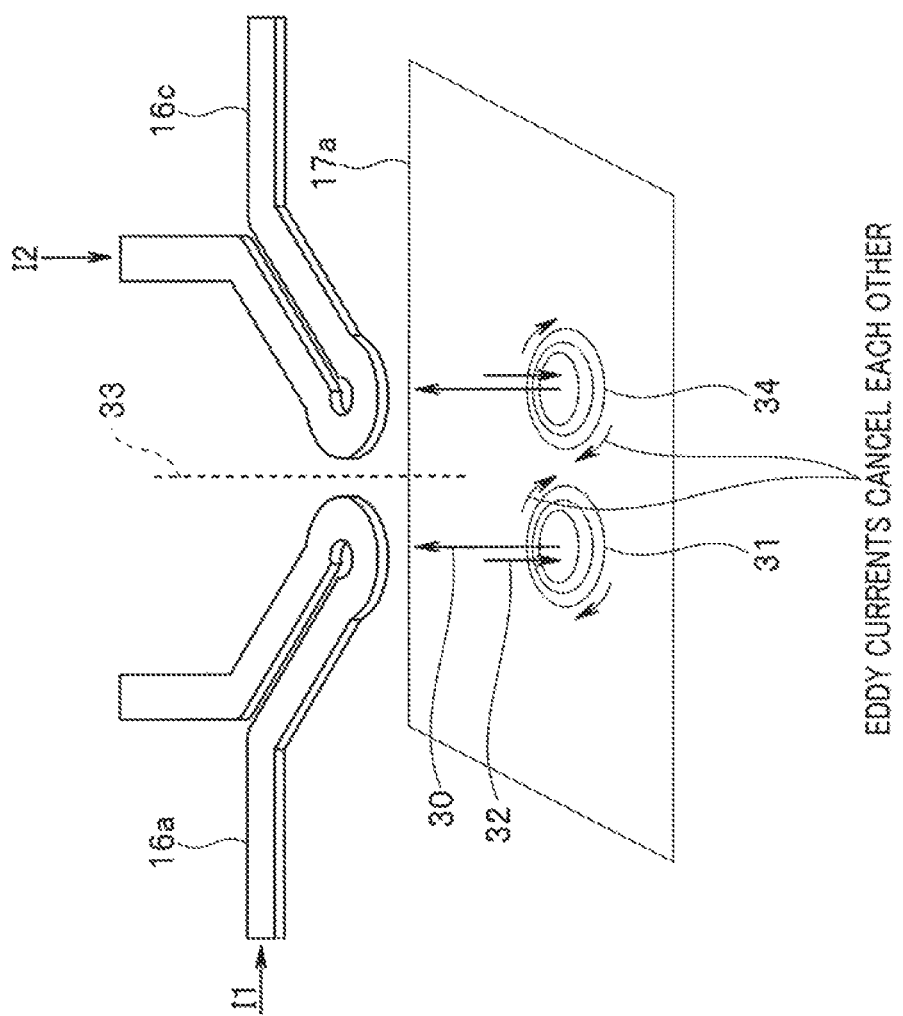
FIG. 3 is a view for describing one example of a state where an eddy current generated in a shield layer is canceled.

FIG. 3 is a view for describing one example of a state where an eddy current generated in a shield layer is canceled.

When an electric current I1 is supplied to the coil pattern 16a, a magnetic field is generated in the first direction (a direction indicated by symbol 30). An eddy current 31 is generated in the shield layer 17a by being effected by the generated magnetic field. The eddy current 31 generates a magnetic field in a direction which obstructs the magnetic field in the first direction, that is, a magnetic field in the second direction (a direction indicated by symbol 32) which is a direction opposite to the first direction.

Accordingly, the magnetic field in the first direction is cancelled by the magnetic field in the second direction so that a magnetic field detected by the Hall element 19 is lowered. As a result, the current detection device 1 cannot accurately detect the current I1 which flows through the coil patterns 16a and 16b.

In the embodiment, the coil pattern 16c is disposed in a spaced apart manner from the coil pattern 16a with respect to the axis 33 perpendicular to the shield layer 17a. By supplying a current I2 to the coil pattern 16c, a magnetic field is generated in the first direction, and an eddy current 34 is generated in the shield layer 17a by being effected by the generated magnetic field.

Although the direction that the eddy current 31 flows and the direction that the eddy current 34 flows are equal, the coil patterns 16a and 16c are disposed in a spaced apart manner with respect to the axis 33 perpendicular to the shield layer 17a and hence, the eddy currents 31 and 34 cancel each other. As a result, a magnetic field in the second direction generated by the eddy current 31 can be reduced.

In this manner, according to the current detection device of the embodiment, a magnetic field detected by the Hall element can be increased.

Figure 4:
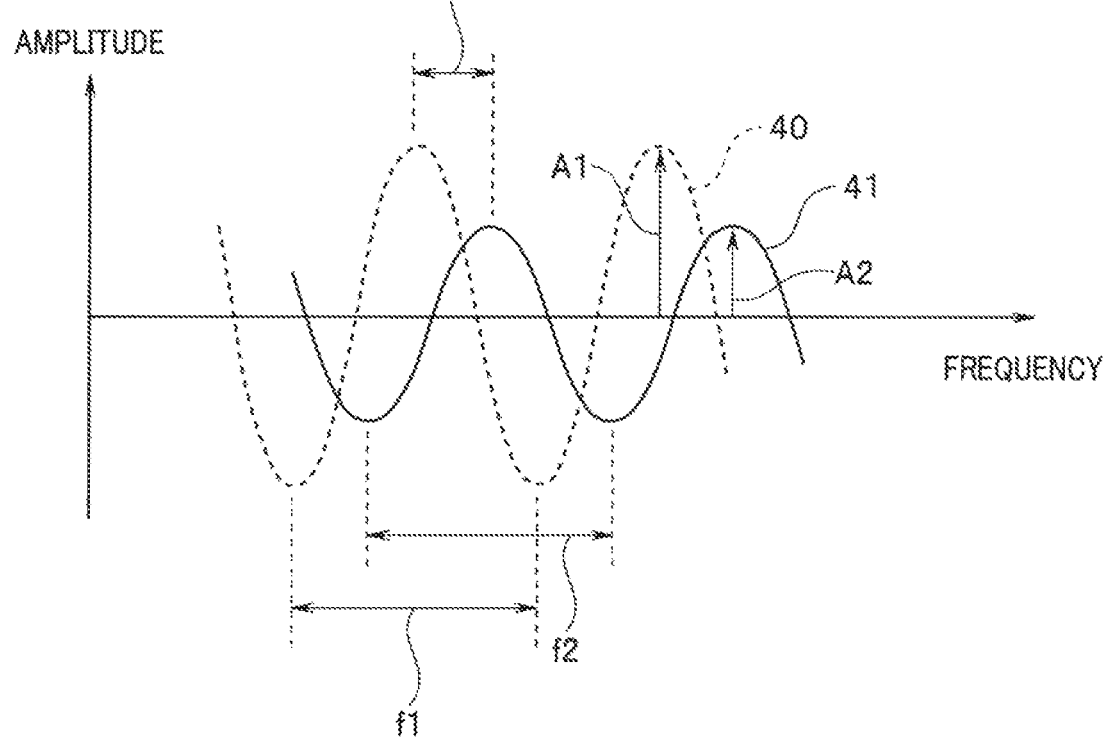
FIG. 4 is a view for describing waveforms of eddy currents 31 and 34 generated in the shield layer 17*a* by supplying currents I1 and I2 to coil patterns 16*a* and 16*c*.

FIG. 4 is a view for describing waveforms of the eddy currents 31 and 34 generated in the shield layer 17a by supplying currents I1 and I2 to the coil patterns 16a and 16c.

A waveform 40 indicates the waveform of the eddy current 31 generated in the shield layer 17a by supplying the current I1 to the coil pattern 16a. The waveform 40 of the eddy current 31 has a frequency f1 and an amplitude A1.

A waveform 41 indicates the waveform of the eddy current 34 generated in the shield layer 17a by supplying the current I2 to the coil pattern 16c The waveform 41 of the eddy current 34 has a frequency f2 and an amplitude A2. As shown in FIG. 4, a displacement of phase occurs between the waveform 40 of the eddy current 31 and the waveform 41 of the eddy current 34.

The operation circuit 13 adjusts the current I2 supplied to the coil pattern 16c based on a voltage signal which is detected by the Hall element 19 and is amplified by the amplifying circuit 11. In other words, the operation circuit 13 can control a phase, a frequency, and an amplitude of the eddy current 34 by adjusting the current I2 supplied to the coil pattern 16c corresponding to intensity of the eddy current 31 generated by supplying the current I1 to the coil pattern 16a.

A cancelling effect of the eddy current 31 and the eddy current 34 becomes maximum when the operation circuit 13 adjusts the current I2 such that the frequency f1 of the eddy current 31 and the frequency 2 of the eddy current 34 become equal, the amplitude A1 of the eddy current 31 and the amplitude A2 of the eddy current 34 are equal, and a phase of the eddy current 31 and a phase of the eddy current 34 are displaced from each other by 180°. Even in a case where the amplitude A2 of the eddy current 34 is lower than the amplitude A1 of the eddy current 31, the eddy current 31 can be cancelled and hence, a cancelling effect can be acquired.

The coil pattern 16c may be disposed on the surface 10b. With such a configuration, an eddy current generated in the shield layer 17b by supplying a current I1 to the coil pattern 16b can be cancelled and hence, the current detection device 1 can detect the current I1 more accurately.

Each of the coil patterns 16a, 16b, and 16c is configured of the planar coil having an arcuate shape and having a hole at a center of the planar coil; and the straight line portions extending from the end portions of the planar coil having the arcuate shape and disposed parallel to each other. However, the shapes of the respective coil patterns 16a, 16b, and 16c are not limited to such a shape. For example, respective coil patterns 16a, 16b, and 16c may be formed in shapes shown in FIG. 5, FIG. 6, and FIG. 7.

Figure 5:
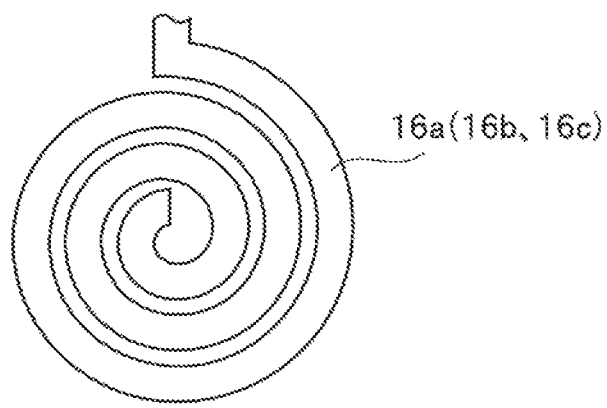
FIG. 5 is a plan view of a planar coil where each coil pattern has a spiral shape.

FIG. 5 is a plan view of a planar coil where each coil pattern has a spiral shape. As shown in FIG. 5, each coil pattern 16a, 16b, 16c forms a three-turn planar coil formed by winding the coil in a spirally curved shape. The number of turns of each coil pattern 16a, 16b, 16c is not limited to three turns, and may be other number of turns.

Figure 6:
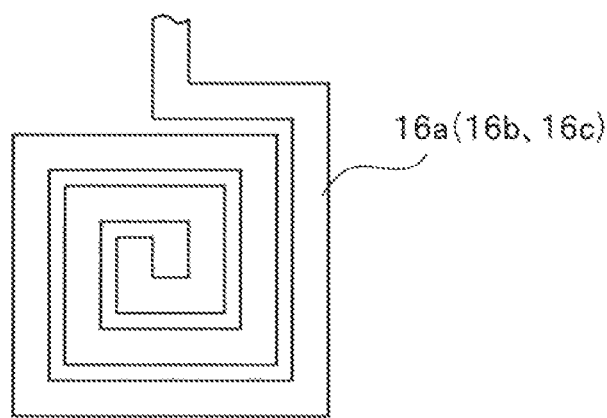
FIG. 6 is a plan view of a planar coil where each coil pattern has a rectangular shape.

FIG. 6 is a plan view of a planar coil where each coil pattern has a rectangular shape. As shown in FIG. 6, each coil pattern 16a, 16b, 16c forms a three-turn planar coil formed in a rectangular shape as a whole by connecting straight lines instead of curved lines. The number of turns of each coil pattern 16a, 16b, 16c is not limited to three turns, and may be other number of turns.

Figure 7:
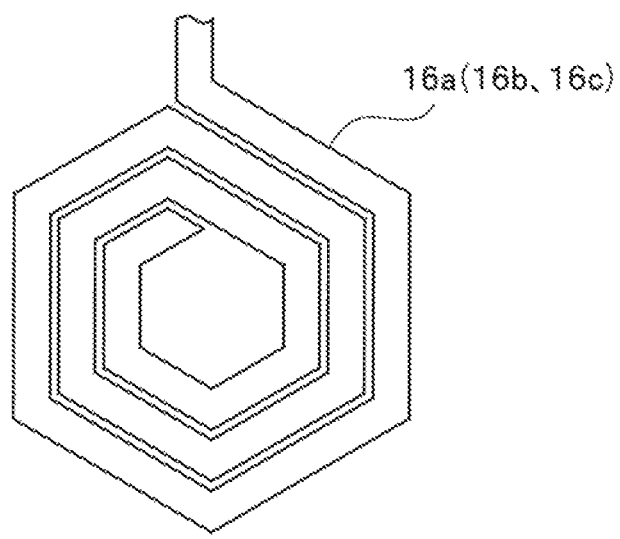
FIG. 7 is a plan view of a planar coil where each coil pattern has a hexagonal shape.

FIG. 7 is a plan view of a planar coil where each coil pattern has a hexagonal shape. As shown in FIG. 7, each coil pattern 16a, 16b, 16c forms a three-turn planar coil formed in a hexagonal shape as a whole by connecting straight lines instead of curved lines. The number of turns of each coil pattern 16a, 16b, 16c is not limited to three turns, and may be other number of turns. The shape of each coil pattern 16a, 16b, 16c is not limited to hexagonal shape, and may be other polygonal shape such as a triangular shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detection device comprising:
a first coil having a planar shape;
a magnetic field detection element disposed in a spaced apart manner from the first coil in a direction orthogonal to a plane of the first coil, the magnetic field detection element being disposed so as to receive a magnetic field which the first coil generates;
a shield layer disposed between the first coil and the magnetic field detection element;
a second coil having a planar shape, the second coil being disposed in a spaced apart manner from the first coil with respect to an axis perpendicular to the shield layer; and
an operation circuit configured to operate the second coil, wherein
the shield layer is disposed so as to overlap the first coil and the second coil when viewed from a direction perpendicular to a plane of the shield layer.

2. The current detection device according to claim 1, wherein the operation circuit is configured of an oscillation circuit or a high-frequency circuit.

3. The current detection device according to claim 1, further comprising a third coil having a planar shape, wherein
a center axis of a magnetic flux which the first coil generates and a center axis of a magnetic flux which the third coil generates are positioned on a same axis, and
the magnetic field detection element is disposed between the first coil and the third coil, and is disposed on the same axis.

4. The current detection device according to claim 3, wherein the third coil is formed of a planar coil having a spiral shape, a rectangular shape, or a hexagonal shape.

5. The current detection device according to claim 1, wherein the shield layer is configured to shield an electrostatic noise or an electromagnetic noise from entering the magnetic field detection element or a drive circuit of the magnetic field detection element.

6. The current detection device according to claim 1, further comprising:
an amplifying circuit configured to amplify a voltage signal detected by the magnetic field detection element; and
a drive circuit configured to drive the magnetic field detection element.

7. The current detection device according to claim 1, wherein the first coil and the second coil each are formed of a planar coil having a spiral shape, a rectangular shape, or a hexagonal shape.

8. The current detection device according to claim 1, wherein the operation circuit supplies a second current to the second coil so as to generate a second eddy current for cancelling a first eddy current, the first eddy current being generated in the shield layer by a first current being supplied to the first coil.

* * * * *